US008813012B2

(12) United States Patent
Rieger et al.

(10) Patent No.: US 8,813,012 B2
(45) Date of Patent: Aug. 19, 2014

(54) SELF-ALIGNED VIA INTERCONNECT USING RELAXED PATTERNING EXPOSURE

(75) Inventors: Michael L. Rieger, Skamania, WA (US); Victor Moroz, Saratoga, CA (US)

(73) Assignee: Synopsys, Inc., Mountain View, CA (US)

(*) Notice: Subject to any disclaimer, the term of this patent is extended or adjusted under 35 U.S.C. 154(b) by 39 days.

(21) Appl. No.: 13/550,460

(22) Filed: Jul. 16, 2012

(65) Prior Publication Data
US 2014/0015135 A1    Jan. 16, 2014

(51) Int. Cl.
*G06F 17/50*    (2006.01)

(52) U.S. Cl.
USPC ............................ 716/110; 716/100; 716/122

(58) Field of Classification Search
CPC . G06F 17/50; G06F 17/5045; G06F 17/5068; G06F 17/5081
USPC ........................... 716/100, 110–111, 119, 122
See application file for complete search history.

(56) References Cited

U.S. PATENT DOCUMENTS 6,400,030 B1 * 6/2002 Wang et al. .................. 257/774

* cited by examiner

*Primary Examiner* — Paul Dinh
(74) *Attorney, Agent, or Firm* — Fenwick & West LLP

(57) ABSTRACT

Self-aligned via interconnects using relaxed patterning exposure. In accordance with a first method embodiment, a method for controlling a computer-aided design (CAD) system for designing physical features of an integrated circuit includes accessing a first pattern for first metal traces on a first metal layer, accessing a second pattern for second metal traces on a second metal layer, vertically adjacent to the first metal layer and accessing a precise pattern of intended interconnections between the first and second metal traces. The precise pattern of intended interconnections is operated on to form an imprecise via pattern that indicates a plurality of general areas in which vias are allowed. The imprecise via pattern is for use in an integrated circuit manufacturing process to form, in conjunction with operations to form the first and second metal layers, a plurality of self-aligned vias for interconnecting the intended interconnections.

20 Claims, 14 Drawing Sheets

SELF-ALIGNED VIA INTERCONNECT USING RELAXED PATTERNING EXPOSURE

FIELD OF INVENTION

Embodiments of the present invention relate to the field of integrated circuit design and manufacture. More specifically, embodiments of the present invention relate to systems and methods for self-aligned via interconnects using relaxed patterning exposure.

BACKGROUND

In integrated circuits, traces or "wires" on various layers are electrically connected to traces on other layers by means of vertical metal "vias" between such layers. Under the conventional art, the pattern of vias between two layers, e.g., wiring or metal layers, is completely defined lithographically by exposing an image of a mask via pattern, etching holes in the separating dielectric, and then filling the holes with metal, e.g., copper.

Unfortunately, due to a variety of factors, including, e.g., small via size and high density of vias, and because of the requirement to align the via pattern to the interacting wire patterns, the via processing steps are among the most lithographically challenging and costly steps in an integrated circuit manufacturing process. Accordingly, the minimum spacing of vias is frequently about 20% larger than a minimum spacing of lines. Thus, a via pattern may frequently limit an achievable line-pattern density of the metal layers they connect.

SUMMARY OF THE INVENTION

Therefore, what is needed are systems and methods for self-aligned via interconnects using relaxed patterning exposure. What is additionally needed are systems and methods for self-aligned via interconnects using relaxed patterning exposure reduce the requirements for alignment of a via pattern mask. A further need exists for systems and methods for self-aligned via interconnects using relaxed patterning exposure that are compatible and complementary with existing systems and methods of integrated circuit design, manufacturing and test. Embodiments of the present invention provide these advantages.

In accordance with a first method embodiment of the present invention, a method for controlling a computer-aided design (CAD) system for designing physical features of an integrated circuit includes accessing a first pattern for first metal traces on a first metal layer, accessing a second pattern for second metal traces on a second metal layer, vertically adjacent to the first metal layer and accessing a precise pattern of intended interconnections between the first and second metal traces. The precise pattern of intended interconnections is operated on to form an imprecise via pattern that indicates a plurality of general areas in which vias are allowed. The imprecise via pattern is for use in an integrated circuit manufacturing process to form, in conjunction with operations to form the first and second metal layers, a plurality of self-aligned vias for interconnecting the intended interconnections. The imprecise via pattern may include at least one region for forming vias comprising at least two adjacent instances of the interconnections.

In accordance with another method embodiment of the present invention, a width is defined for a conductive via between a first trace on a first metal layer and a second trace on a second metal layer adjacent to the first metal layer, the width is greater than a width of the first trace. A length is defined for the via that is substantially the same as a width of the second trace, and the length and the width are filled with metal while forming the second trace. The method may include exposing a via pattern that indicates regions to be free of vias, and further indicates areas where vias are to be formed, and wherein further the areas are not in exact conformance with intersections of traces on the first and second metal layers.

In accordance with an embodiment of the present invention in accordance with the present invention, an integrated circuit includes a first metal layer comprising traces and a second metal layer comprising traces, above and immediately adjacent to the first metal layer. The integrated circuit additionally includes a via coupling a first metal trace on the first metal layer to a second metal trace on the second metal layer. The via extends in a first horizontal dimension to a width greater than a width of the first metal trace and extends in a second horizontal dimension, perpendicular to the first horizontal dimension, to a length about equal to a width of the second metal trace.

In accordance with a third method embodiment of the present invention, a first metal layer of an integrated circuit is formed. A void is patterned in materials to separate metal layers of the integrated circuit. The void is partially filled during formation of a second metal layer vertically adjacent to and above the first metal layer. The void is wider than a width of traces of the first metal layer.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale

DETAILED DESCRIPTION

Figure 1A:
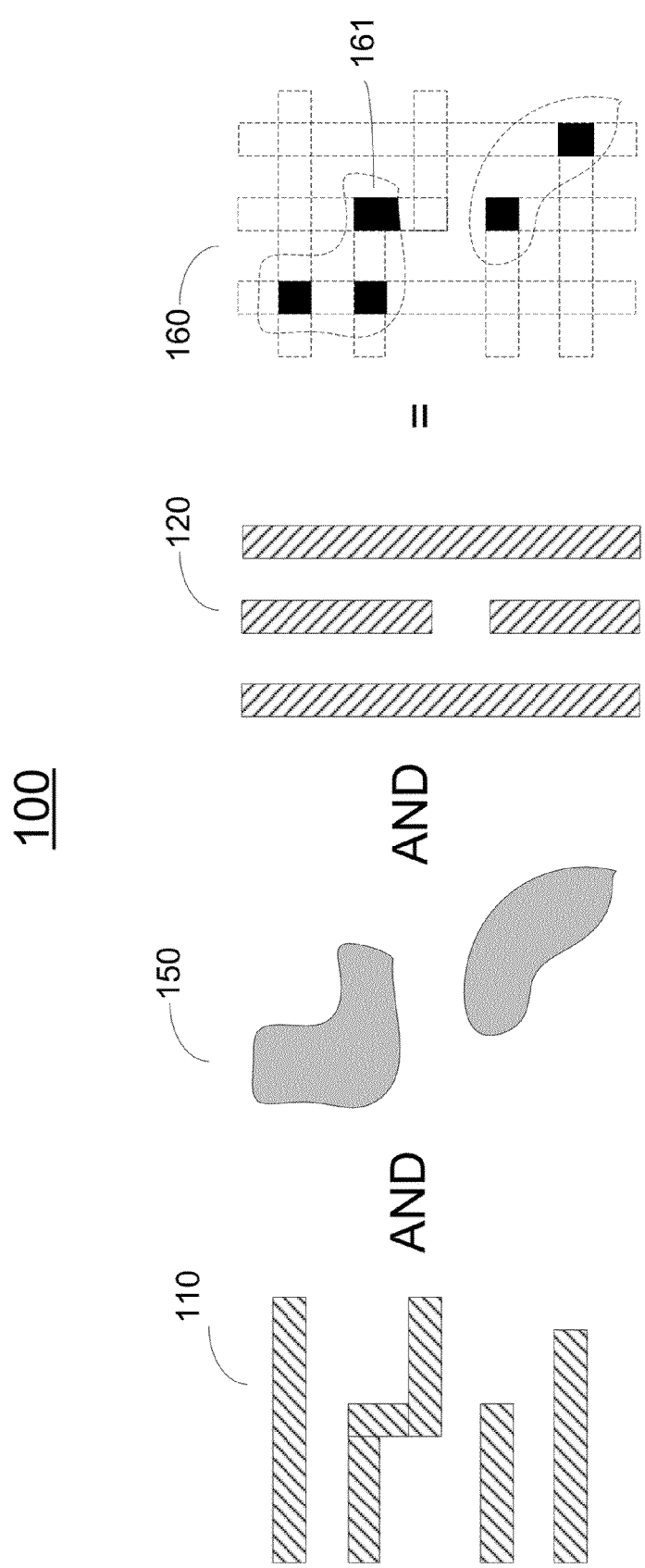
FIG. 1A illustrates a method of forming a pattern of vias for interconnecting a plurality of metal traces, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions which follow (e.g., process 100, 200, 290 and 300, and the process embodied in FIGS. 5-10) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "controlling" or "designing" or "accessing" or "forming" or "performing" or "determining" or "defining" or "filling" or "exposing" or "attaching" or "processing" or "singulating" or "roughening" or "filling" or "generating" or "adjusting" or "creating" or "executing" or "continuing" or "indexing" or "computing" or "translating" or "calculating" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Systems and Methods for Self-Aligned Via Interconnects Using Relaxed Patterning Exposure As used in the present disclosure, terms such as "pattern," "pattern for metal" and/or "metal pattern" may refer to representations that typically exist in, are generated by and manipulated by a computer aided design (CAD) system. CAD systems are widely utilized in a variety of stages of designing an integrated circuit, including, for example, schematic capture, layout, design rules checking (DRC) and generation of tools, e.g., masks, used during a manufacturing process. In other cases, some such "patterns" may also be rendered as physical masks used in a photolithographic integrated circuit manufacturing process. In some other cases, some such "patterns" may refer to physically rendered features of an integrated circuit.

FIG. 1A illustrates a method 100 of forming vias for interconnecting a plurality of metal traces in an integrated circuit, in accordance with embodiments of the present invention. Exemplary metal pattern 110 represents a portion of a metal wiring layer for an integrated circuit. The traces, or wires, of metal pattern 110 are substantially horizontal in extent, although that is not required.

Exemplary metal pattern 120 represents a portion of a metal wiring layer for an integrated circuit. The traces, or wires, of metal pattern 120 are substantially vertical in extent, although that is not required.

Pattern 150 is a "generous via" pattern used to guide placement of via interconnects between metal patterns 110 and 120. For example, pattern 150 may be used as a pattern to etch a portion of an integrated circuit to allow metal of metal pattern 120 to fill into such etched portions, making electrical contact with metal of metal pattern 110. The formation of a generous via pattern is further described below, e.g., in FIGS. 2D to 2F and/or 3A to 3C. The use of a generous via pattern, e.g., etching and filling within an integrated circuit manufacturing process, is further described below, e.g., in FIGS. 4 through 10.

Actual via pattern 160 illustrates a pattern of metal interconnects, or vias, formed in an integrated circuit, in accordance with embodiments of the present invention. The solid black areas of pattern 160, generally located at some intersections of the horizontal traces 110 and vertical traces 120 (indicated by dotted lines in 160), indicate the actual metal interconnects, or vias. It is to be appreciated that actual via pattern 160 is the logical AND combination of metal pattern 110 AND metal pattern 120 AND generous via pattern 150. Actual via pattern 160 may be produced by a series of integrated circuit manufacturing operations.

For example, metal pattern 110 may be rendered by an image exposure as part of a dual damascene process to form a metal layer of an integrated circuit. As previously discussed, generous via pattern 150 may be rendered as a hole (or holes) in various layers of an integrated circuit, which may then be selectively filled by metal of metal pattern 120, e.g., via a dual damascene process, to produce actual via pattern 160.

It is to be appreciated that via 161 of actual via pattern 160 is larger than the other vias of actual via pattern 160. For example, via 161 extends beyond the vertical extend of the corresponding horizontal trace. In addition, via 161 is less regular than the other vias of actual via pattern 160. For example, the bottom extent of via 161 conforms to the curves of generous via pattern 150, rather than the sharp edges of the corresponding horizontal trace. Such differences in actual vias may result from relaxed pattern exposure, in accordance with embodiments of the present invention.

It is to be appreciated that patterns 110, 120, 150 and 160 may represent physical structures, e.g., intermediate and/or final structures, of an integrated circuit. For example, pattern 150 may be reflected in intermediate structures of an integrated circuit during manufacture. However, pattern 150 may not correspond to physical feature(s) of a final integrated circuit. Patterns 110, 120 and 150 may also represent portions of masks utilized to create, e.g., expose, the corresponding physical patterns. Patterns 110, 120 and 150 are also created, stored and manipulated as data sets by a computer-aided design (CAD) system. For example, patterns 110 and 120 may be created by custom layout design and/or automated routing functions of integrated circuit layout software. As will be further described below, generous via pattern 150 may also be created by such software. It is appreciated that such datasets correspond to physical features of an integrated circuit manufactured as guided by such datasets. Actual via pattern 160 may exist as a data set of a CAD system, although that is not required.

Figure 1B:
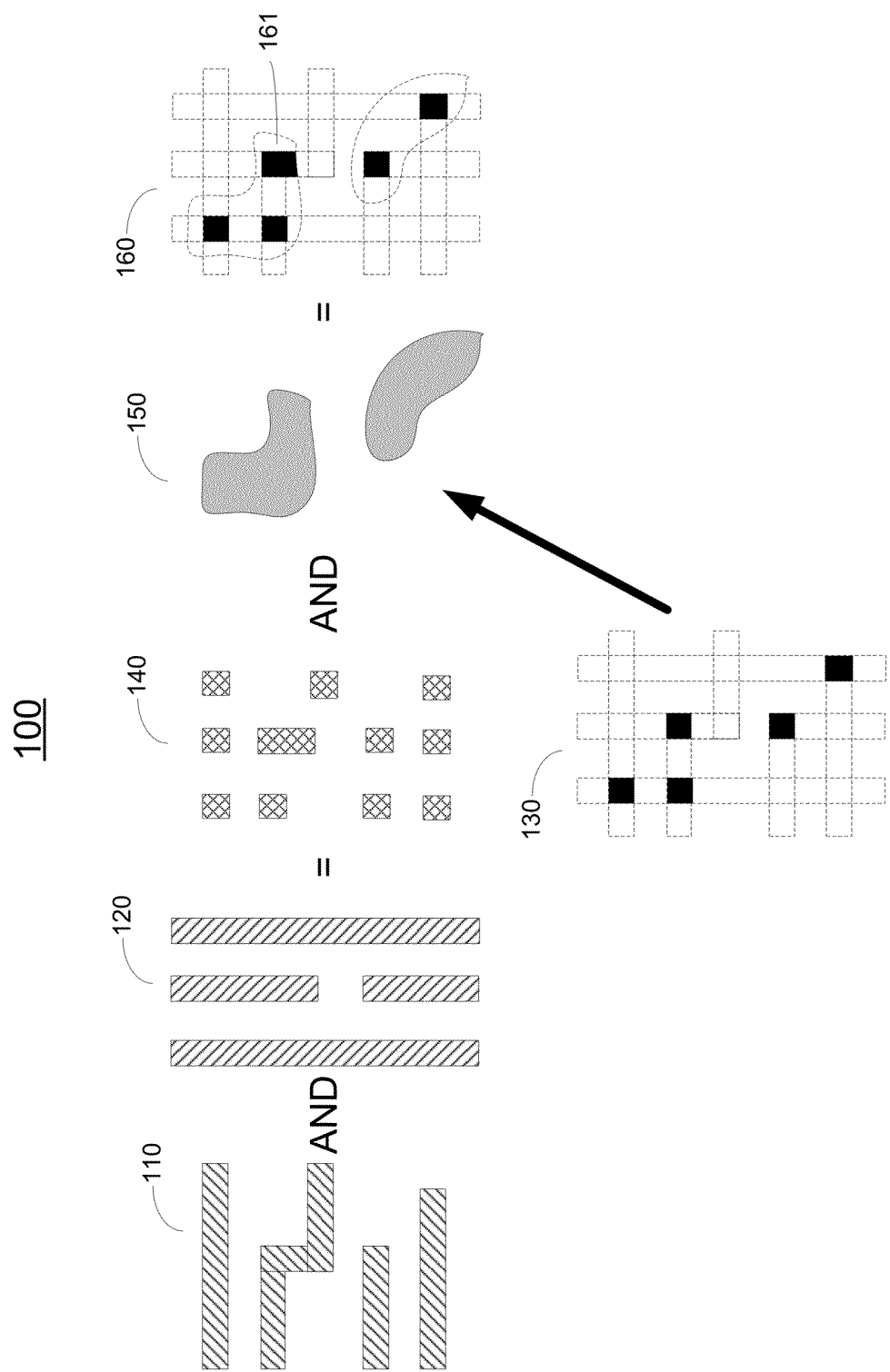
FIG. 1B illustrates a method of forming vias for interconnecting a plurality of metal traces in an integrated circuit, in accordance with embodiments of the present invention.

FIG. 1B further illustrates a method 100 of forming vias for interconnecting a plurality of metal traces in an integrated circuit, in accordance with embodiments of the present invention. Trace intersection pattern 140 illustrates the intersecting locations of interacting metal wiring layers (patterns) to define a plurality of possible via locations. It is appreciated that all such possible via locations may not typically be utilized to form vias. Trace intersection pattern 140 is not necessarily produced by a CAD system; rather it is presented to further illustrate embodiments in accordance with the present invention.

Intended via pattern 130 is typically generated by a computer aided design (CAD) system and reflects the desired electrical connections between metal patterns 110 and 120, e.g., as indicated by an electrical schematic. The solid black areas of pattern 130 indicate the intended via locations. Intended via pattern 130 may also reflect other physical and electrical considerations for the placement of desired vias. It is to be appreciated that intended via pattern 130 is generally a subset of trace intersection pattern 140. For example, trace intersection pattern 140 indicates possible via locations, while intended via pattern 130 indicates the desired via locations. As will be further described below, e.g., with respect to FIGS. 2D-2F and/or FIGS. 3A-3C, intended via pattern 130 is utilized in forming generous via pattern 150.

In accordance with the present invention, a generous, or imprecise via pattern may serve as a mask to other lithographic patterns, and does not need to be critically aligned with other lithographic patterns. For example, a generous via pattern indicates where vias are not to be formed, and indicates a general, but imprecise, area where vias will be formed. Advantageously, a mask implementing a generous via pattern does not require critical alignment, dimensional control and/or feature density to the degree required of a conventional via pattern mask, in accordance with embodiments of the present invention.

Figure 2C:
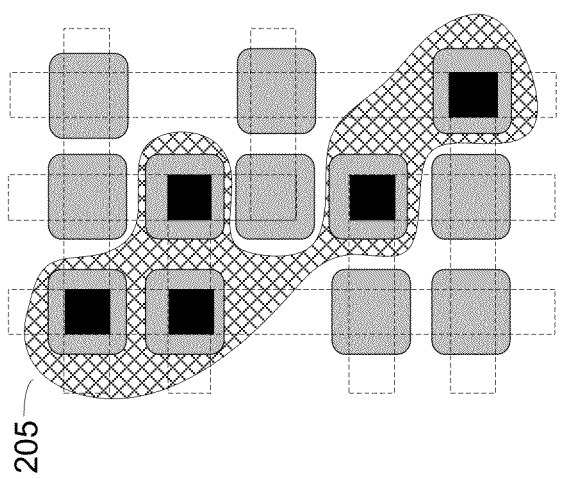
FIGS. 2A, 2B and 2C illustrate an exemplary general method for forming a generous via pattern, in accordance with embodiments of the present invention.
Figure 2B:
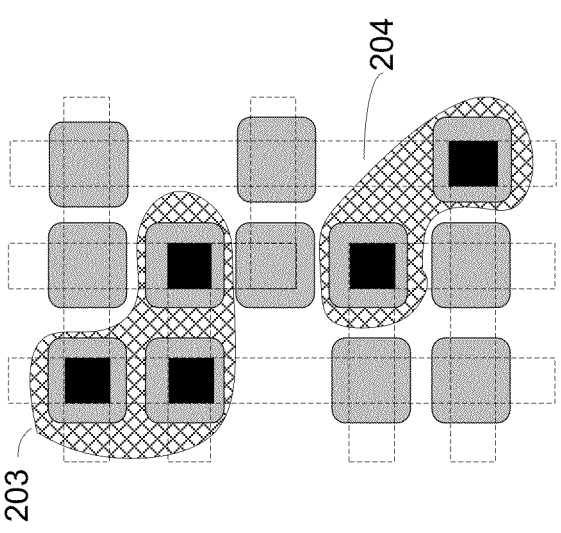
Figure 2A:
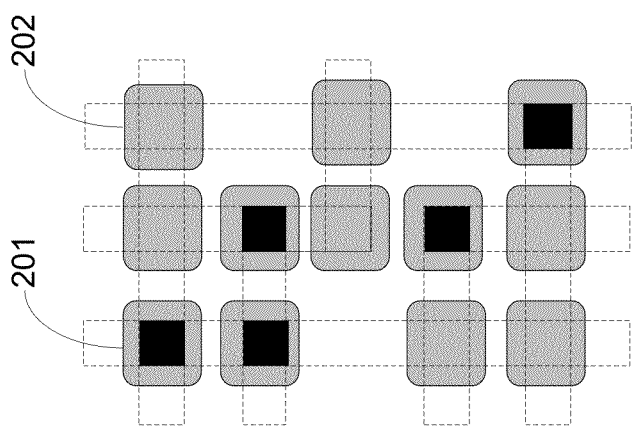

FIGS. 2A-2C illustrate an exemplary general method 200 for forming a generous via pattern, e.g., generous via pattern 150 (FIG. 1A), in accordance with embodiments of the present invention. In FIG. 2A, a plurality of guard regions (201, 202) is formed around every intersection of trace intersection pattern 140 (FIG. 1B). The guard region accounts for the layer-to-layer overlay uncertainty in a wafer lithography process. The guard region may extend from at least this uncertainty amount up to one half of a distance to an adjacent intersection. Using information of intended via pattern 130, the plurality of guard regions are separated into guard regions around an intended via 201, and guard regions around non vias 202.

In accordance with embodiments of the present invention, a generous via pattern, e.g., generous via pattern 150 (FIG. 1A), may comprise any pattern that encloses one or more guard regions 201 and does not infringe a guard region 202. Two exemplary patterns that meet this criteria are illustrated in FIGS. 2B and 2C, below.

FIG. 2B illustrates exemplary generous via patterns 203 and 204, in accordance with embodiments of the present invention. Generous via pattern 203 encloses three intended via locations, e.g., in the upper left of the intended via pattern 130 (FIG. 1B). Generous via pattern 204 encloses two intended via locations, e.g., in the lower right of the intended via pattern 130 (FIG. 1B).

FIG. 2C illustrates exemplary generous via pattern 205, in accordance with embodiments of the present invention. Generous via pattern 205 encloses all intended via locations as shown in the intended via pattern 130 (FIG. 1B).

Figure 2D:
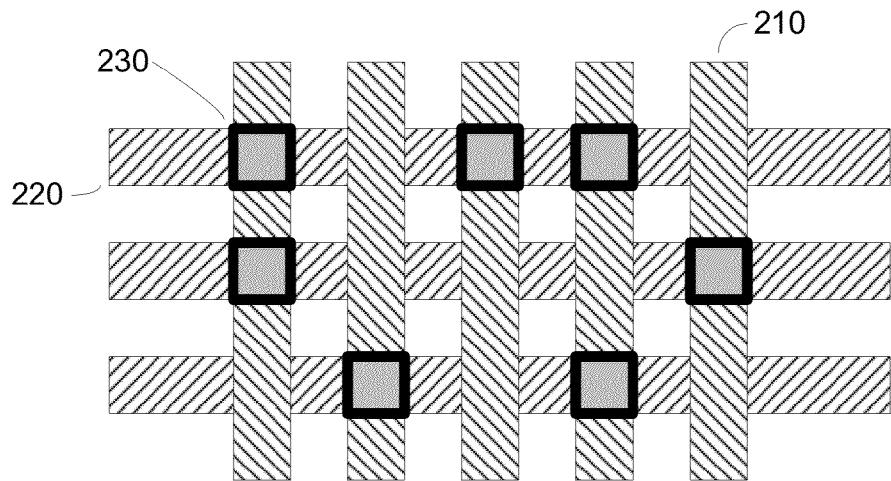
FIGS. 2D, 2E and 2F illustrate an exemplary method of forming a generous via pattern, in accordance with embodiments of the present invention.
Figure 2E:
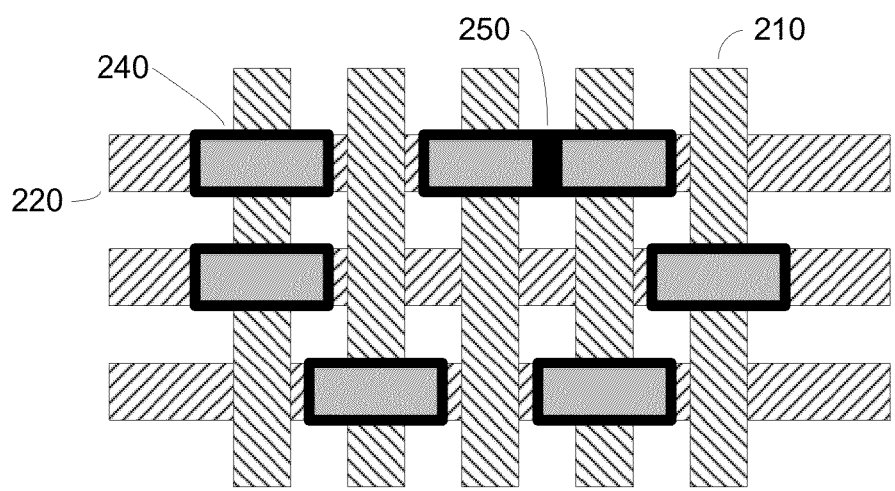
Figure 2F:
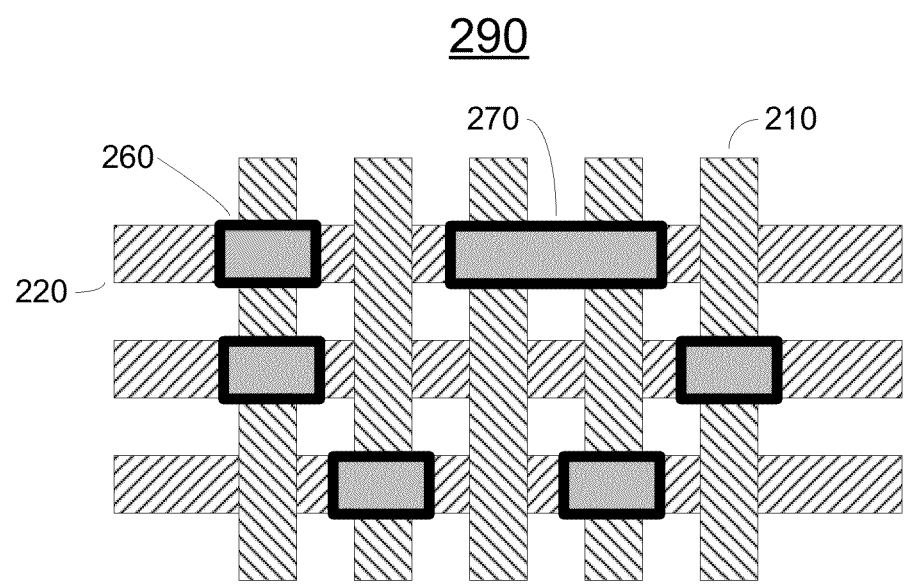

FIGS. 2D-2F illustrate an exemplary method 290 of forming a generous via pattern, e.g., generous via pattern 150 (FIG. 1A), in accordance with embodiments of the present invention. FIG. 2D illustrates a pattern for metal traces 220 to be formed on a first metal layer, e.g., of an integrated circuit under design. Pattern for metal traces 210 to be formed on a second metal layer is also illustrated. The second metal layer is to be formed above the first metal layer. For example, the second metal layer is intended to be formed after the first metal layer. The traces are designed with a minimum pitch, e.g., a repetitive spacing, of P. The traces, or wires, are designed to have a minimum width, W.

A pattern of desired vias 230 is created. Vias 230 represent desired connections between metal traces, or wires, on the first layer and metal traces, or wires, on the second layer, and may be analogous to intended via pattern 130 of FIG. 1B. The desired vias 230 are drawn with a length and width of W.

FIG. 2E illustrates processing of via pattern 230 (FIG. 2D) to form a generous via pattern, in accordance with embodiments of the present invention. The vias of pattern 230 are "upsized," or stretched in one dimension, such that their long dimension is given by Relation 1, below:

$$(P-W)/2 + \in \quad \text{(Relation 1)}$$

where epsilon, $\in$, is a small value very much smaller than the minimum trace pitch, P. Epsilon, $\in$, should be chosen to ensure that adjacent, stretched vias overlap. Such stretching may be accomplished by use of a "size up" or similar command in computer aided design (CAD) software, e.g., a design rules checking (DRC) program.

It is appreciated that the stretching of the via shapes is in only one dimension, in this embodiment of the invention. The stretching is in the direction of, or aligned with the lower metal layer. In the exemplary embodiment of FIG. 2E, pattern for metal traces 220 are designated as the lower of the two metal traces. As pattern for metal traces 220 runs horizontally, the vias are stretched horizontally, as illustrated by vias 240 in FIG. 2E. If, for example, the relative position of the two metal layers were reversed, a vertical layer would be the lower layer, and the vias would be stretched in a vertical direction.

It is appreciated that adjacent vias 230 (FIG. 2D) may overlap or merge when stretched, as illustrated by overlap region 250.

FIG. 2F illustrates further processing of via pattern 240 (FIG. 2E) to form a generous via pattern, in accordance with embodiments of the present invention. FIG. 2F shows the vias 240 (FIG. 2E) downsized, e.g., shrunk, in one dimension, e.g., the previously stretched dimension, by the same amount specified in Relation 1, above. The pattern is then upsized in all directions, forming a generous via pattern 260, in accordance with embodiments of the present invention. The upsizing should be by at least the process overlay margin, but small enough such that the overlay margin of an "unintended" via is not infringed. Such shrinking may be accomplished by use of a "size down" or similar command in computer aided design (CAD) software, e.g., a design rules checking (DRC) program. It is appreciated that the adjacent vias 230 (FIG. 2D) have merged into a single shape 270.

It is to be appreciated that the preceding description of a formation of a generous via pattern is exemplary, and not limiting. Embodiments in accordance with the present invention are well suited to other methods of forming a generous via pattern.

Copper (Cu) is commonly used in metal traces and vias of integrated circuits. Copper (Cu) is generally considered not to be etchable. Accordingly, the processes of method 290 may be utilized in conjunction with non-etchable metals, or with a process that does not etch metal layers.

Figure 3A:
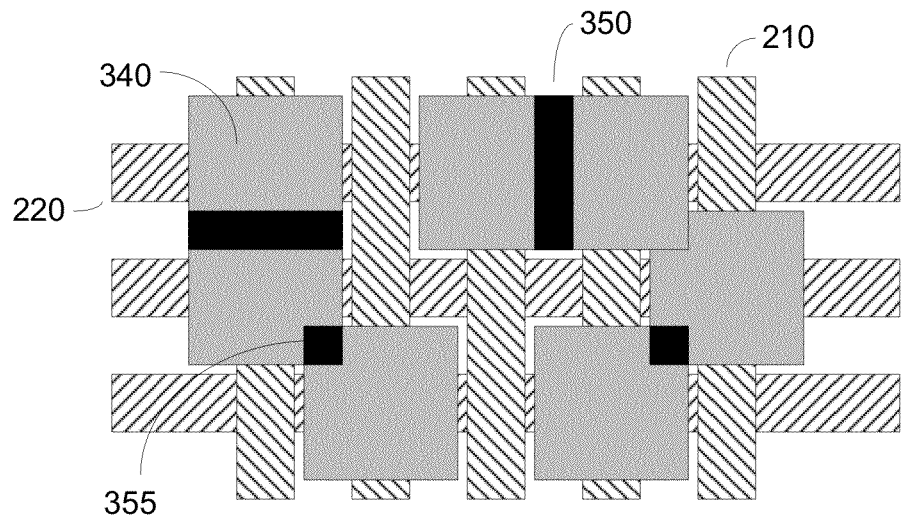
FIGS. 3A, 3B and 3C illustrate an exemplary method of forming a generous via pattern for use with alternative interconnection processes, in accordance with embodiments of the present invention.
Figure 3B:
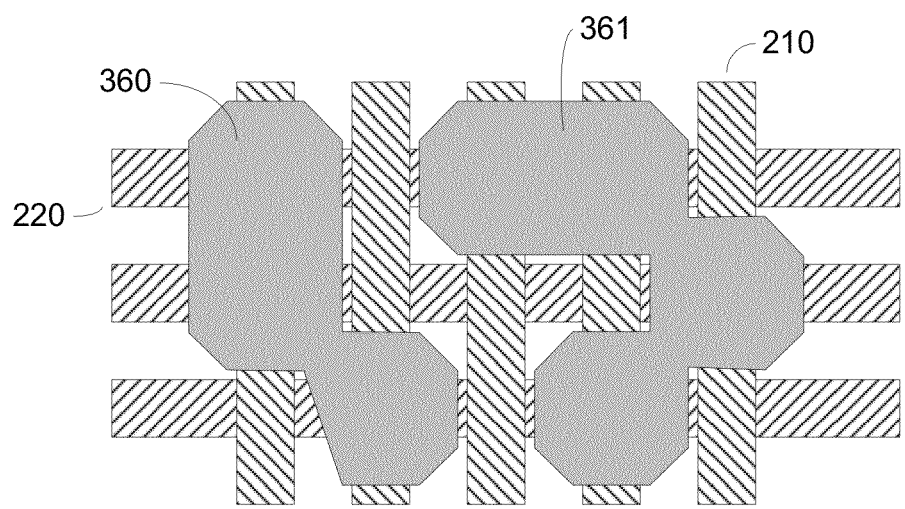
Figure 3C:
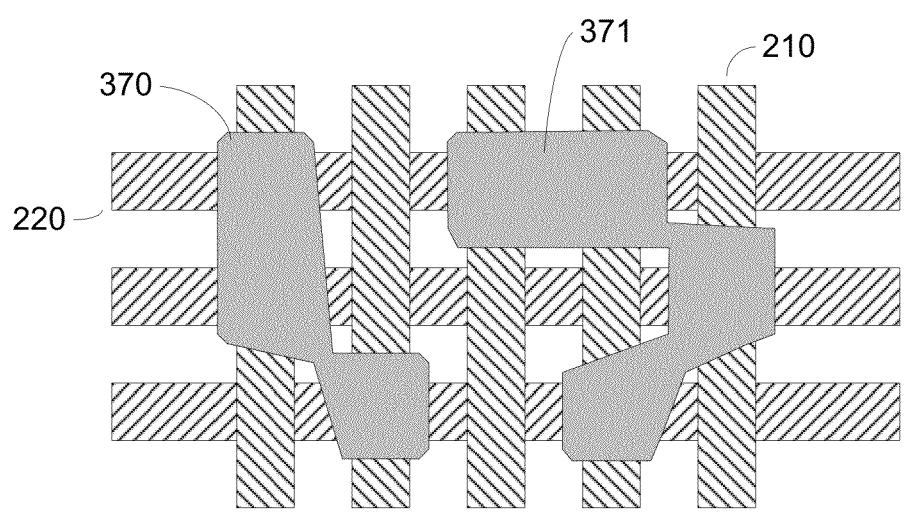

FIGS. 3A-3C illustrate an exemplary method 300 of forming a generous via pattern, e.g., generous via pattern 150 (FIG. 1A), for use with alternative interconnection processes, for example, a process in which, unlike copper, the conducting material is etchable, in accordance with embodiments of the present invention. FIG. 3A illustrates processing of desired via pattern 230 (FIG. 2D) to form a generous via pattern, in accordance with embodiments of the present invention.

In FIG. 3A, the vias of pattern 230 are "upsized," or stretched in two dimensions, such that their length and width dimensions are given by Relation 1, above. Accordingly, pattern 340 of enlarged vias is formed. It is to be appreciated that many enlarged vias overlap with adjacent vias, for example, side to side or top to bottom, as illustrated by overlap 350, or diagonally, as illustrated by overlap 355.

FIG. 3B illustrates an optional smoothing of a pattern of enlarged vias, in accordance with embodiments of the present invention. The seven vias of pattern 230, having been enlarged (FIG. 3A) now form two smoothed polygonal patterns, 360 and 361.

FIG. 3C illustrates further processing of via pattern 340 (FIG. 3A) to form a generous via pattern, in accordance with embodiments of the present invention. The merged via patterns, e.g., patterns 360 and 361, are shrunk, in two dimensions by the same amount specified in Relation 1, above. The pattern is then upsized in all directions, forming a generous via pattern, comprising patterns 370 and 371, in accordance with embodiments of the present invention. The upsizing should be by at least the process overlay margin, but small enough such that the overlay margin of an "unintended" via is not infringed.

Figure 4:
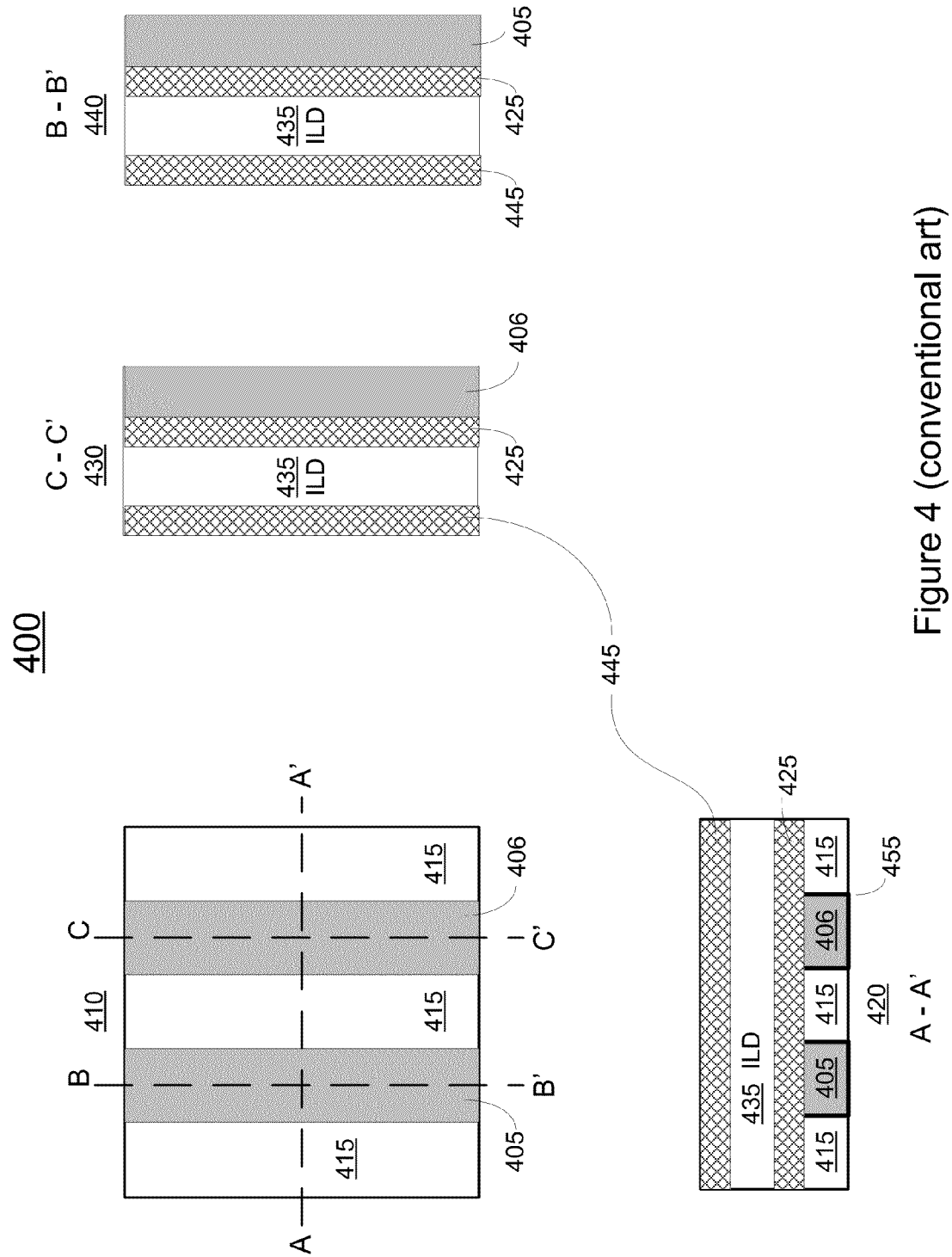
FIG. 4 illustrates a stage in a process of forming a via between metal traces on different layers utilizing a generous via pattern, in accordance with the conventional art.

FIGS. 4 through 10 illustrate a method of forming a via between metal traces on different layers utilizing a generous via pattern, in accordance with embodiments of the present invention. FIG. 4 illustrates a stage in a process of forming a via between metal traces on different layers of an integrated circuit utilizing a generous via pattern, in accordance with the conventional art. The conditions of FIG. 4 may form an initial configuration for the practice of embodiments in accordance with the present invention. FIG. 4 illustrates a plan view 410 of a portion of an integrated circuit 400. Plan view 410 illustrates two metal traces, traces 405 and 406, embedded in an intra-layer dielectric 415. Additional layers above traces 405, 406 and intra-layer dielectric 415, which may be illustrated in other views, are not shown in plan view 410 for clarity.

Cross sectional view 420 illustrates a cross section of the integrated circuit portion 400 corresponding to section A-A', illustrated in plan view 410. In addition to traces 405, 406 and intra-layer dielectric 415, section 420 illustrates a first isolating nitride layer 425, e.g., comprising silicon nitride (SiN), inter-layer dielectric 435 and second isolating nitride layer 445. Traces 405 and 406 may be surrounded, as illustrated in section 420, by a conductive nitride blocking layer 455, e.g., comprising tantalum nitride (TaN) or titanium nitride (TiN) 455.

Cross sectional view 430 illustrates a cross section of the integrated circuit portion 400 corresponding to section C-C', illustrated in plan view 410. Cross sectional view 440 illustrates a cross section of the integrated circuit portion 400 corresponding to section B-B', illustrated in plan view 410. It is appreciated that cross-sections 430 and 440 are substantially similar at this initial stage of processing.

Figure 5:
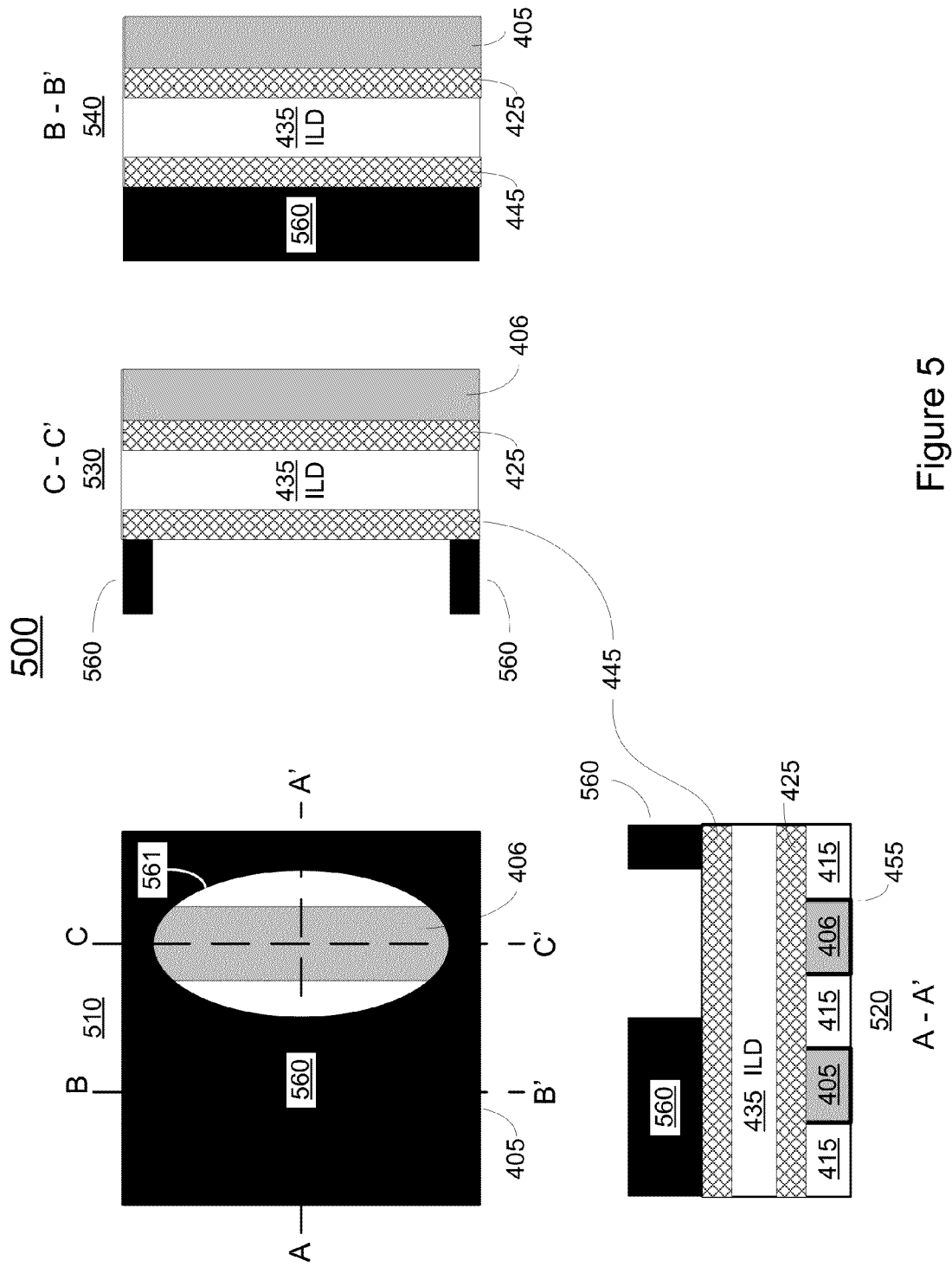
FIG. 5 illustrates application of a generous via mask to an integrated circuit, in accordance with embodiments of the present invention.

FIG. 5 illustrates further processing in a process of forming a via between metal traces on different layers utilizing a generous via pattern, in accordance with embodiments of the present invention. Sections 520, 530 and 540 illustrate sections of integrated circuit portion 500 corresponding to sections 420, 430 and 440, e.g., corresponding to sections A-A', C-C', and B-B', respectively, as previously described with respect to FIG. 4. FIG. 5 illustrates a generous via pattern 560, applied to the top of integrated circuit portion 500. Generous via pattern 560 may comprise a photo resist and/or a mask to limit a later stage of processing, e.g., etching. As illustrated in section 510, trace 405 is completely obscured, while a portion of trace 406 is visible. It is appreciated that an open area or hole 561 of pattern 560 is wider and longer than a width of metal trace 406.

As further described below, generous via pattern 560 determines a plurality of regions where vias are not to be formed, e.g., the black portion of generous via pattern 560, as illustrated in FIG. 5. Holes in generous via pattern 560, e.g., hole 561, determine a general region for formation of vias, but do not precisely determine where vias will be formed, in accordance with embodiments of the present invention. For example, the illustrated embodiment may form a via coupling to trace 406, but may not form a coupling to trace 405, as trace 405 is completely obscured by generous via pattern 560.

Figure 6:
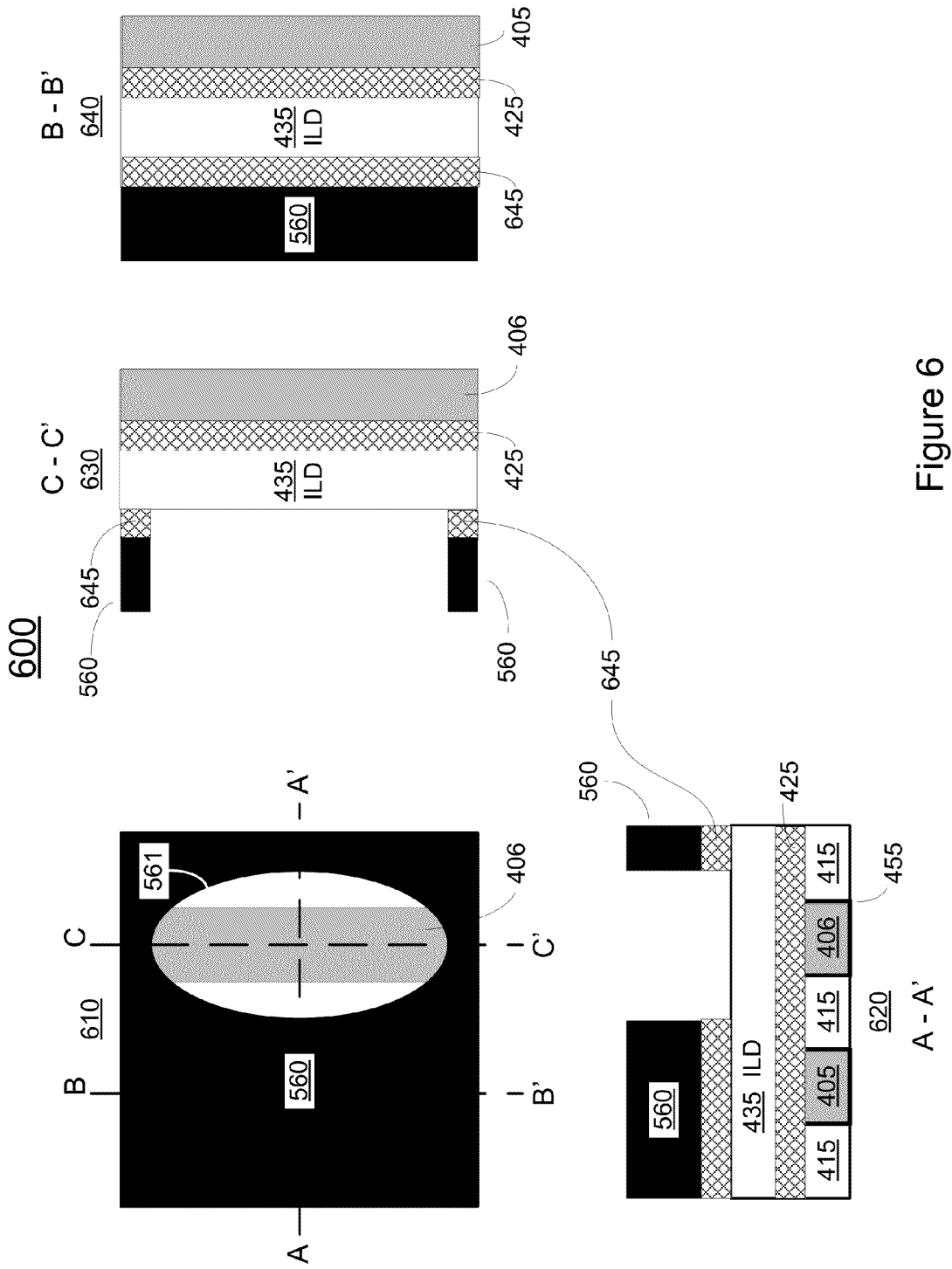
FIG. 6 illustrates etching of a nitride layer to an integrated circuit, in accordance with embodiments of the present invention.

FIG. 6 illustrates further processing in a process of forming a via between metal traces on different layers utilizing a generous via pattern, in accordance with embodiments of the present invention. Sections 620, 630 and 640 illustrate sections of integrated circuit portion 600 corresponding to sections 420, 430 and 440, e.g., corresponding to sections A-A', C-C', and B-B', respectively, as previously described with respect to FIG. 4. In FIG. 6, the second nitride layer 445 (FIG. 4) on integrated circuit portion 600 is etched, using generous via pattern 560 as a guide, to produce etched second nitride layer 645. It is appreciated that etched second nitride layer 645 comprises the same material at the same level of the integrated circuit as second nitride layer 445 (FIG. 4). However, etched second nitride layer 645 has a different pattern than second nitride layer 445 (FIG. 4).

Figure 7:
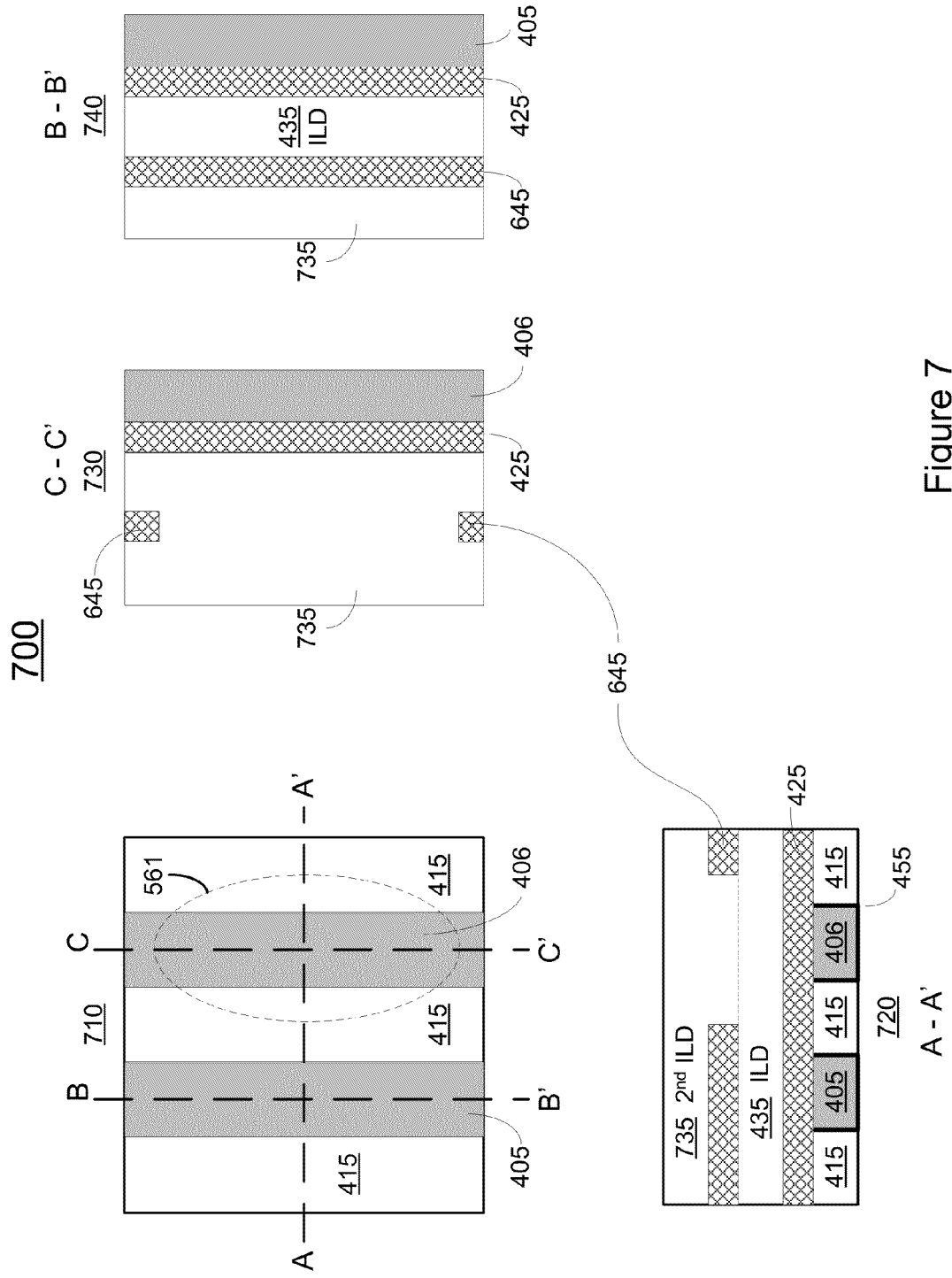
FIG. 7 illustrates adding a second inter-layer dielectric to an integrated circuit, in accordance with embodiments of the present invention.

FIG. 7 illustrates further processing in a process of forming a via between metal traces on different layers utilizing a generous via pattern, in accordance with embodiments of the present invention. Sections 720, 730 and 740 illustrate sections of integrated circuit portion 700 corresponding to sections 420, 430 and 440, e.g., corresponding to sections A-A', C-C', and B-B', respectively, as previously described with respect to FIG. 4. In FIG. 7, the generous via pattern 560 is removed, and a second inter-layer dielectric 735 is applied. It is appreciated that second inter-layer dielectric 735 makes contact with inter-layer dielectric 435 in regions where portions of second nitride layer 645 are open, e.g., where first nitride layer 425 (FIG. 4) have been etched away.

Figure 8:
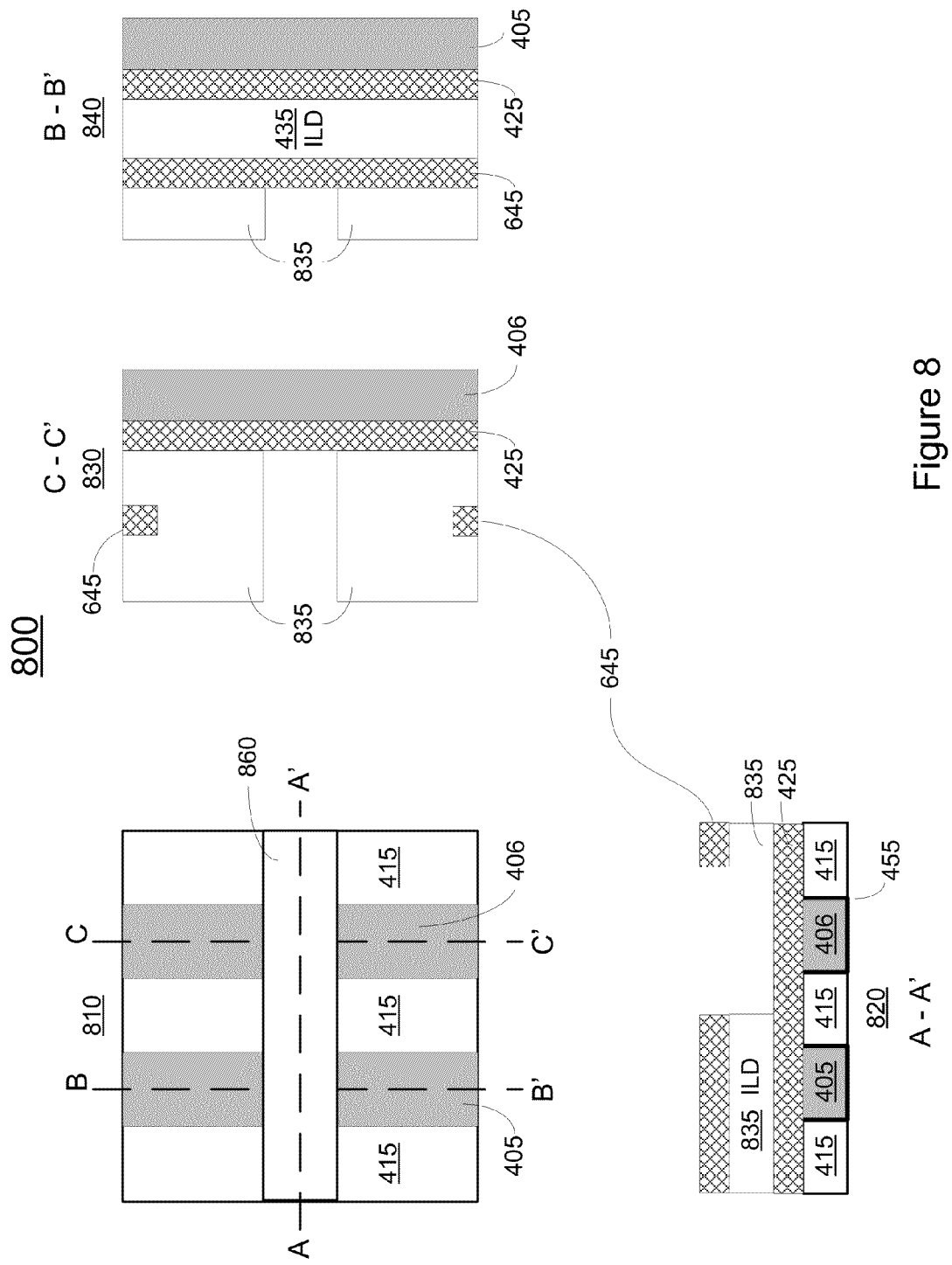
FIG. 8 illustrates etching a pattern for a metal trace on an integrated circuit, in accordance with embodiments of the present invention.

FIG. 8 illustrates further processing in a process of forming a via between metal traces on different layers utilizing a generous via pattern, in accordance with embodiments of the present invention. Sections 820, 830 and 840 illustrate sections of integrated circuit portion 800 corresponding to sections 420, 430 and 440, e.g., corresponding to sections A-A', C-C', and B-B', respectively, as previously described with respect to FIG. 4. In FIG. 8, a pattern 860 is set out for a metal trace on a second metal layer, above the first metal layer that comprises metal traces 405 and 406. According to the pattern 860, second inter-layer dielectric 735 (FIG. 7) and inter-layer dielectric 435 are etched. As is illustrated in section 840, the etching is stopped at etched second nitride layer 645. However, as shown in sections 820 and 830, etched second nitride layer 645 is not present in the region of etching, having been previously etched itself, and etching proceeds down to nitride layer 425 in the indicated areas. The etching produces combined inter-layer dielectric 835, which comprises portions of inter-layer dielectric 435 (FIG. 7) and second inter-layer dielectric 735 (FIG. 7).

Figure 9:
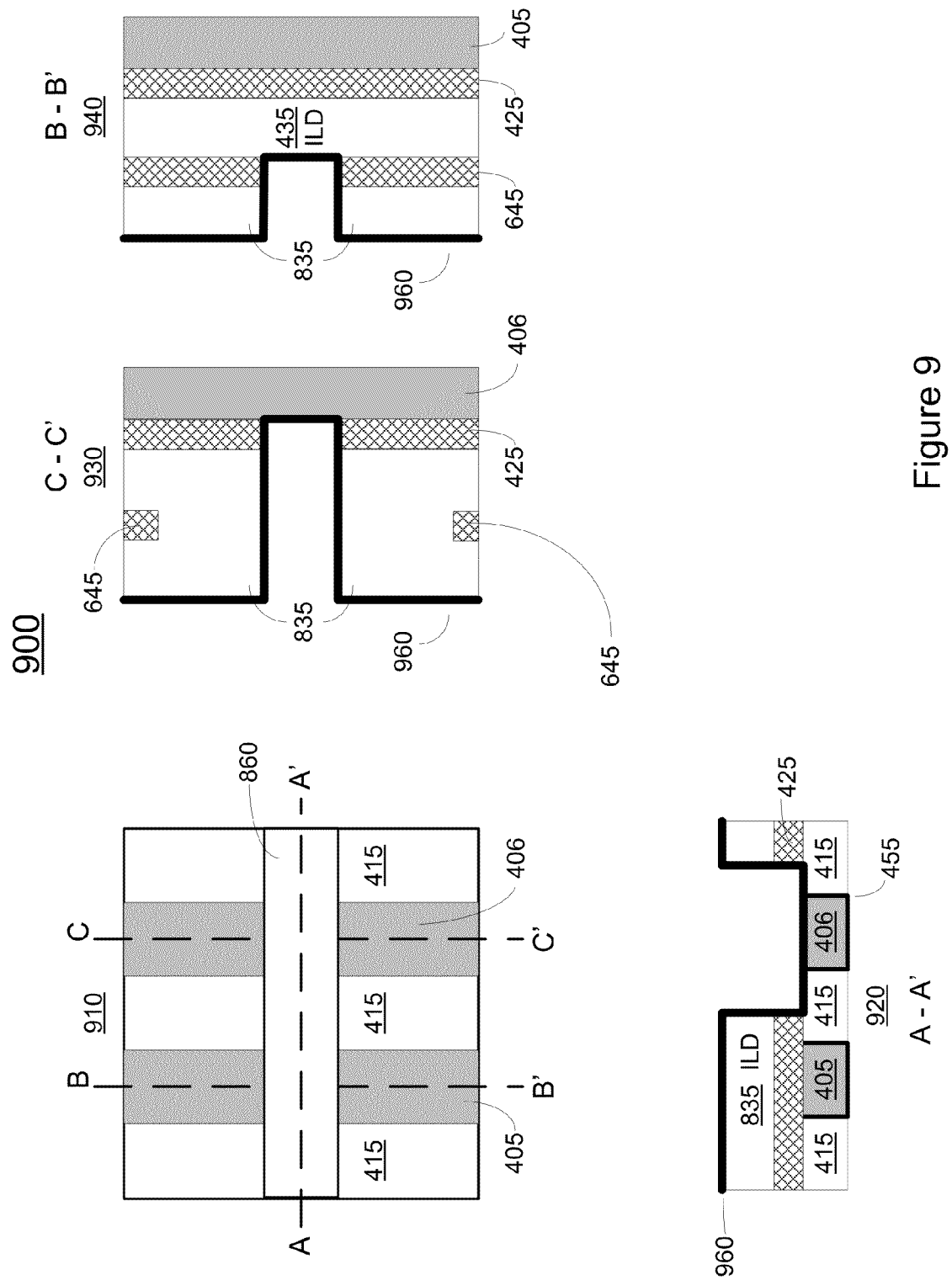
FIG. 9 illustrates application of a nitride blocking layer on an integrated circuit, in accordance with embodiments of the present invention.

FIG. 9 illustrates further processing in a process of forming a via between metal traces on different layers utilizing a generous via pattern, in accordance with embodiments of the present invention. Sections 920, 930 and 940 illustrate sections of integrated circuit portion 900 corresponding to sections 420, 430 and 440, e.g., corresponding to sections A-A', C-C', and B-B', respectively, as previously described with respect to FIG. 4. In FIG. 9, a conductive blocking layer 960, e.g., comprising tantalum nitride (TaN) or titanium nitride (TiN), is formed on exposed surfaces as indicated in sections 920, 930 and 940.

Figure 10:
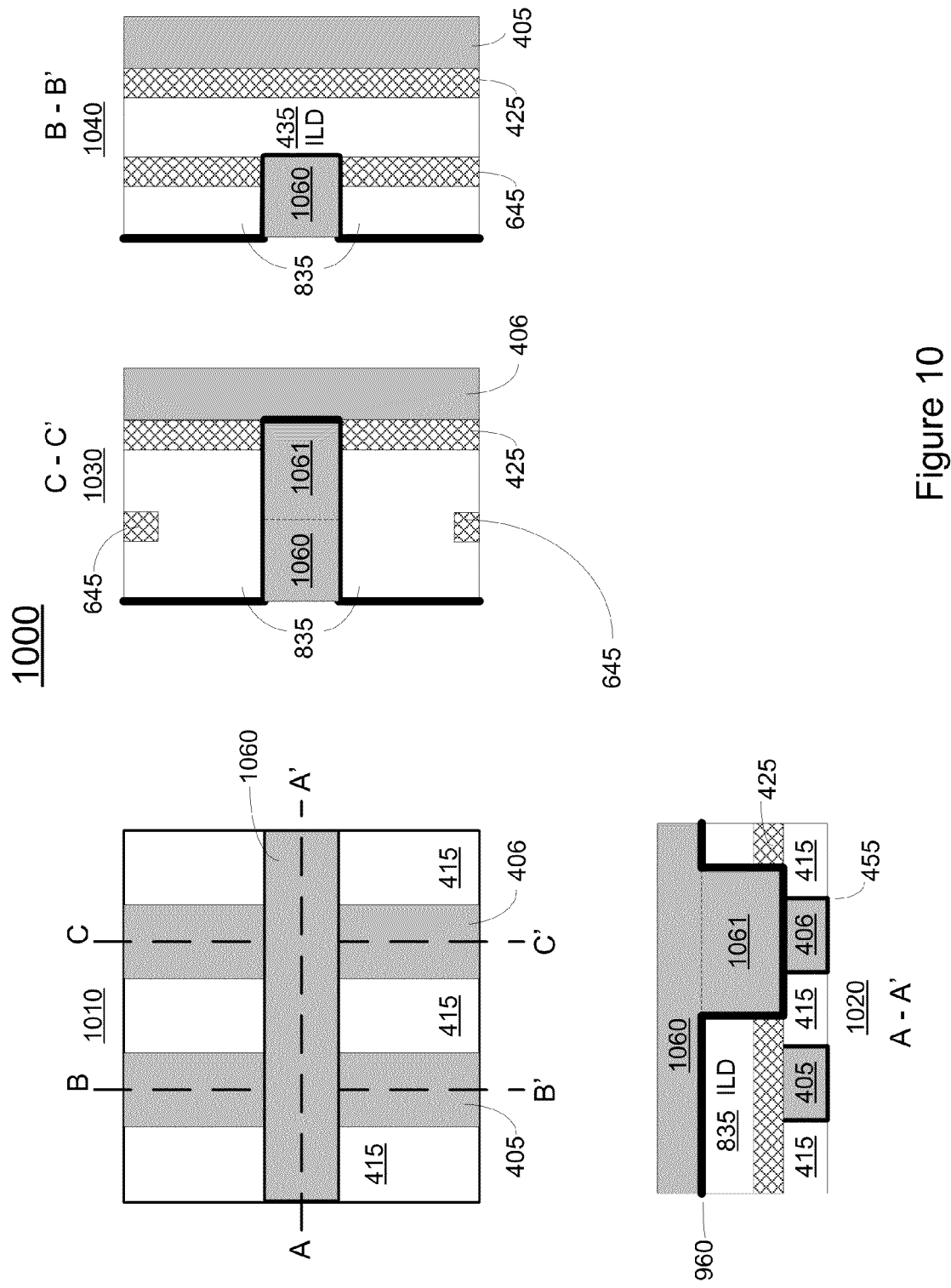
FIG. 10 illustrates formation of a self-aligned via on an integrated circuit, in accordance with embodiments of the present invention.

FIG. 10 illustrates further processing in a process of forming a via between metal traces on different layers utilizing a generous via pattern, in accordance with embodiments of the present invention. Sections 1020, 1030 and 1040 illustrate sections of integrated circuit portion 1000 corresponding to sections 420, 430 and 440, e.g., corresponding to sections A-A', C-C', and B-B', respectively, as previously described with respect to FIG. 4. In FIG. 10 the etched hole 860 (FIG. 8), previously lined with blocking layer 960 (FIG. 9) is filled with metal, e.g., copper (Cu), for example via a dual Damascene or other suitable process. A chemical mechanical polishing or other suitable process may trim excess metal so that trace 1060 has a suitable profile. Such filling produces a metal trace or wire 1060 on a second metal layer, and also produces a via 1061 to couple metal trace 1060 to trace 406 on the lower metal layer. It is appreciated that trace 1060 and via 1061 comprise the same material, formed in the same operation. Via 1061 corresponds to the material that is below the nominal level of the second metal layer, e.g., at about the same level as inter-layer dielectric 735, and first and second nitride layers 425 and 645.

It is to be appreciated that the pattern 860 (FIG. 8) for the metal trace on the second metal layer, provides the critical location for via 1061, e.g., the via is self-aligned with a metal trace on the second metal layer by the mask for such metal trace. In contrast, the alignment of hole 561 of generous via pattern 560 is far less critical. For example, generous via pattern 560 primarily identifies where vias are not to be formed, and gives a general, non-critically-aligned indication of where vias will be located. In accordance with embodiments of the present invention, vias between layers are self-aligned to interacting metal traces.

With reference to FIGS. 6 and 10, it is to be appreciated that the hole etched in second nitride layer 445 (FIG. 5) to form etched second nitride layer 645 (FIG. 6), e.g., as illustrated in section 630 of FIG. 6, is larger, e.g., generous, than the via 1061 eventually formed through such hole, e.g., as illustrated in section 1030 of FIG. 10.

For example, with reference once again to FIG. 5, consider that the hole 561 forms an ellipse. It is appreciated that hole 561 of generous via pattern 560 indicates a general region where a via is to be formed. Accordingly, a width of a via 1061, as illustrated in section 1020 of FIG. 10, is determined by the length of the minor axis, e.g., the horizontal axis, of hole 561. The width of trace 1060, e.g., as shown in plan view 1010 of FIG. 10, determines the other plan dimension, e.g., the length, of via 1061.

In this novel manner, the requirements for alignment features and process alignment for a generous via mask are reduced or relaxed in comparison to a via mask under the conventional art, in accordance with embodiments of the present invention. Further, under the conventional art, placement and alignment of vias may limit the wiring density or pitch of metal layers. In accordance with embodiments of the present invention, such constraints are beneficially eliminated.

For example, given a dense pattern of vias, the minimum pitch, e.g., the center-spacing distance between adjacent features, is twice that of the original via pattern. The worst-case generous via pitch occurs when every other lower line requires a via connection to the same upper line. Wherever adjacent lower lines require via connections to the same upper metal, the generous via may merge to a single shape. This substantially lowers the resolution and accuracy required of an exposure tool used for a generous via pattern.

Embodiments in accordance with the present invention provide systems and methods for self-aligned via interconnects using relaxed patterning exposure. In addition, embodiments in accordance with the present invention provide systems and methods for self-aligned via interconnects using relaxed patterning exposure reduce the requirements for alignment of a via pattern mask. Further, embodiments in accordance with the present invention provide for systems and methods for self-aligned via interconnects using relaxed patterning exposure that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A method for controlling a computer-aided design (CAD) system for designing physical features of an integrated circuit, said method comprising:

accessing, by the CAD system, a first trace pattern for first metal traces on a first metal layer;

accessing, by the CAD system, a second trace pattern for second metal traces on a second metal layer, vertically adjacent to said first metal layer;

accessing, by the CAD system, a first via pattern of intended via interconnections between said first and second metal traces; and forming, by the CAD system, a second via pattern based on the first via pattern, the second via pattern indicating a plurality of areas in which vias are allowed during manufacturing of the integrated circuit, the areas of the second via pattern being larger than and enclosing the intended via interconnections of the first via pattern.

2. The method of claim 1, wherein the areas of said second via pattern reflect a pattern of desired via locations of said integrated circuit.

3. The method of claim 1, wherein the areas of said second via pattern affect an extent of at least one actual via during fabrication of the integrated circuit.

4. The method of claim 1 wherein the areas of the second via pattern are larger in at least one dimension than a width of said first metal traces.

5. The method of claim 1, wherein at least one area of the second via pattern encloses two or more intended via interconnections of the first via pattern.

6. The method of claim 1, wherein said second via pattern is independent of differences between adjacent instances of said intended via interconnections.

7. The method of claim 1, wherein forming the second via pattern comprises:
    upsizing the intended via interconnections of the first via pattern into the areas of the second via pattern.

8. The method of claim 7, wherein upsizing the intended via interconnections of the first via pattern into the areas of the second via pattern comprises:
    determining guard regions around the intended via interconnections of the first via pattern, the guard regions being larger than the intended via interconnections; and
    forming the second via pattern based on the guard regions, the areas of the second via pattern guard region enclosing the guard regions.

9. The method of claim 7, wherein upsizing the intended via interconnections of the first via pattern into the areas of the second via pattern comprises:
    stretching the intended via interconnections of the first via pattern into stretched via interconnections, the intended via interconnections stretched in a first direction;
    shrinking the stretched via interconnections into shrunken via interconnections, the stretched via interconnections shrunk in the first direction; and
    upsizing the shrunken via interconnections into the areas of the second via pattern, the shrunken via interconnections upsized in both a first direction and a second direction perpendicular to the first direction.

10. The method of claim 1, wherein the second via pattern corresponds to a mask for manufacturing of the integrated circuit.

11. A non-transitory computer readable medium storing instructions for designing physical features of an integrated circuit, the instructions comprising instructions for:
    receiving a first trace pattern for first metal traces on a first metal layer;
    receiving a second trace pattern for second metal traces on a second metal layer, vertically adjacent to said first metal layer;
    receiving a first via pattern of intended via interconnections between said first and second metal traces; and
    forming a second via pattern based on the first via pattern, the second via pattern indicating a plurality of areas in which vias are allowed during manufacturing of the integrated circuit, the areas of the second via pattern being larger than and enclosing the intended via interconnections of the first via pattern.

12. The computer readable medium of claim 11, wherein the areas of said second via pattern reflect a pattern of desired via locations of said integrated circuit.

13. The computer readable medium of claim 11, wherein the areas of said second via pattern affect an extent of at least one actual via during fabrication of the integrated circuit.

14. The computer readable medium of claim 11 wherein the areas of the second via pattern are larger in at least one dimension than a width of said first metal traces.

15. The computer readable medium of claim 11, wherein at least one area of the second via pattern encloses two or more intended via interconnections of the first via pattern.

16. The computer readable medium of claim 11, wherein said second via pattern is independent of differences between adjacent instances of said intended via interconnections.

17. The computer readable medium of claim 11, wherein forming the second via pattern comprises:
    upsizing the intended via interconnections of the first via pattern into the areas of the second via pattern.

18. The computer readable medium of claim 17, wherein upsizing the intended via interconnections of the first via pattern into the areas of the second via pattern comprises:
    determining guard regions around the intended via interconnections of the first via pattern, the guard regions being larger than the intended via interconnections; and
    forming the second via pattern based on the guard regions, the areas of the second via pattern guard region enclosing the guard regions.

19. The computer readable medium of claim 17, wherein upsizing the intended via interconnections of the first via pattern into the areas of the second via pattern comprises:
    stretching the intended via interconnections of the first via pattern into stretched via interconnections, the intended via interconnections stretched in a first direction;
    shrinking the stretched via interconnections into shrunken via interconnections, the stretched via interconnections shrunk in the first direction; and
    upsizing the shrunken via interconnections into the areas of the second via pattern, the shrunken via interconnections upsized in both a first direction and a second direction perpendicular to the first direction.

20. The computer readable medium of claim 11, wherein the second via pattern corresponds to a mask for manufacturing of the integrated circuit.

* * * * *